United States Patent [19]
Kasai et al.

[11] Patent Number: 5,449,943
[45] Date of Patent: Sep. 12, 1995

[54] VISIBLE AND INFRARED INDIUM ANTIMONIDE (INSB) PHOTODETECTOR WITH NON-FLASHING LIGHT RECEIVING SURFACE

[75] Inventors: Ichiro Kasai, Solvang; Herbert L. Hettich, Goleta; Stephen L. Lawrence, Santa Barbara, all of Calif.

[73] Assignee: Santa Barbara Research Center, Goleta, Calif.

[21] Appl. No.: 253,183

[22] Filed: Jun. 2, 1994

Related U.S. Application Data

[63] Continuation of Ser. No. 742,248, Aug. 8, 1991, abandoned.

[51] Int. Cl.$^6$ .......................................... H01L 27/14
[52] U.S. Cl. ............................. 257/437; 257/441; 257/631
[58] Field of Search ............. 357/30 B, 30 H, 30 L, 357/30 E; 257/437, 441, 289, 292, 631

[56] References Cited

U.S. PATENT DOCUMENTS

| | | | |
|---|---|---|---|
| 3,371,213 | 2/1968 | Adam et al. ............... | 357/30 E |
| 3,567,946 | 3/1971 | Paul ............................ | 357/30 B |
| 3,723,831 | 3/1973 | Rogers ....................... | 357/30 B |
| 4,228,365 | 10/1980 | Gutierrez et al. ......... | 357/24 LR |
| 4,286,277 | 8/1981 | Longshore ................. | 357/30 |
| 4,365,107 | 12/1982 | Yamauchi .................. | 136/258 |
| 4,369,458 | 1/1983 | Thomas et al. ............ | 357/30 H |
| 4,371,587 | 2/1983 | Peters ........................ | 428/446 |
| 4,547,622 | 10/1985 | Fan et al. .................. | 357/30 E |
| 4,651,001 | 3/1987 | Harada et al. ............. | 357/15 |
| 4,734,583 | 3/1988 | Wang ......................... | 250/332 |
| 4,749,952 | 6/1988 | Morimoto ................... | 372/37 |
| 4,881,234 | 11/1989 | Foster et al. .............. | 372/42 |
| 5,051,788 | 9/1991 | Tanaka ....................... | 357/17 |
| 5,086,328 | 2/1992 | Kasai et al. ............... | 257/441 |
| 5,262633 | 11/1993 | Kasai et al. ............... | 257/437 |

FOREIGN PATENT DOCUMENTS

| | | |
|---|---|---|
| 0082035A1 | 6/1983 | European Pat. Off. . |
| 63-268278 | 4/1988 | Japan .................. 357/30 L |
| 63-150976 | 6/1988 | Japan . |
| 2132017 | 6/1984 | United Kingdom . |
| 86/00756A | 1/1986 | WIPO . |

*Primary Examiner*—Sara W. Crane
*Assistant Examiner*—Courtney A. Bowers
*Attorney, Agent, or Firm*—W. C. Schubert; W. K. Denson-Low

[57] ABSTRACT

The light receiving or back-side surface (22) of an indium antimonide (InSb) photodetector device (10) substrate (12) is cleaned to remove all oxides of indium and antimony therefrom. Passivation and/or partially visible light blocking layers (26, 28) are then formed thereon of a material which does not react with InSb to form a structure which would have carrier traps therein and cause flashing. The optical cutoff wavelength and thickness of the partially visible light blocking layer (28) are selected to suppress the avalanche effect in the device (10) at visible wavelengths. This enables the device (10) to operate effectively over a wide wavelength range including the visible and infrared bands. The passivation and/or partially visible light blocking layers (26, 28) may be a thin layer of a semiconductor such as germanium, or silicon dioxide and/or silicon nitride followed by a partially visible light blocking silicon layer.

12 Claims, 4 Drawing Sheets

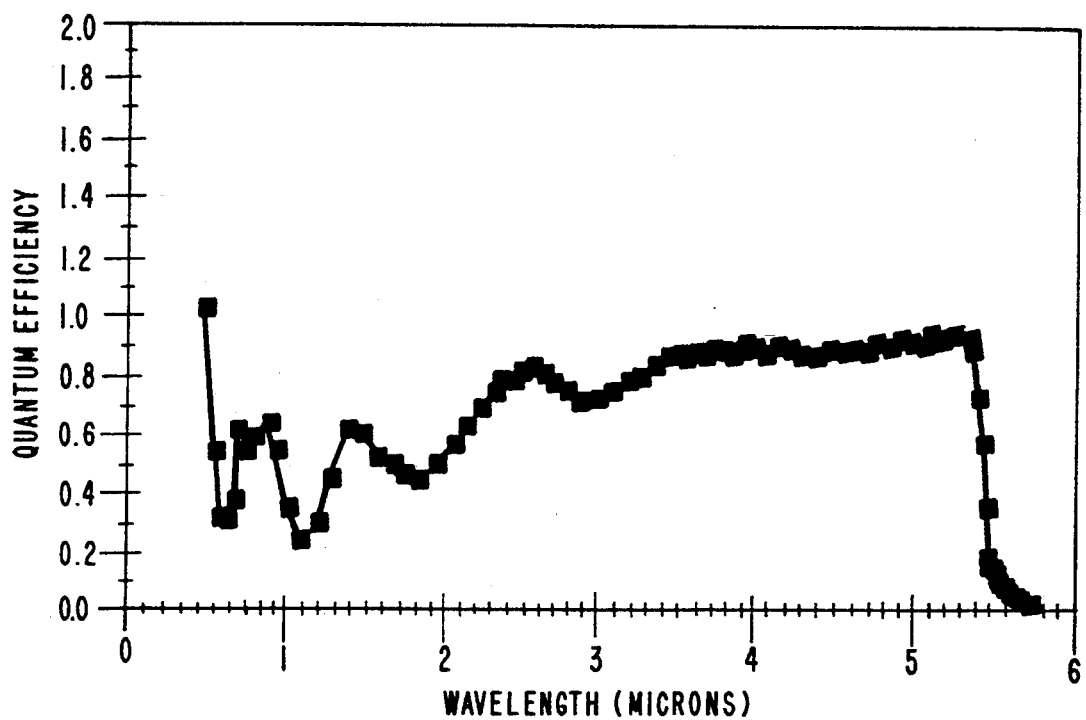
Fig. 5.
Fig. 2. (PRIOR ART)
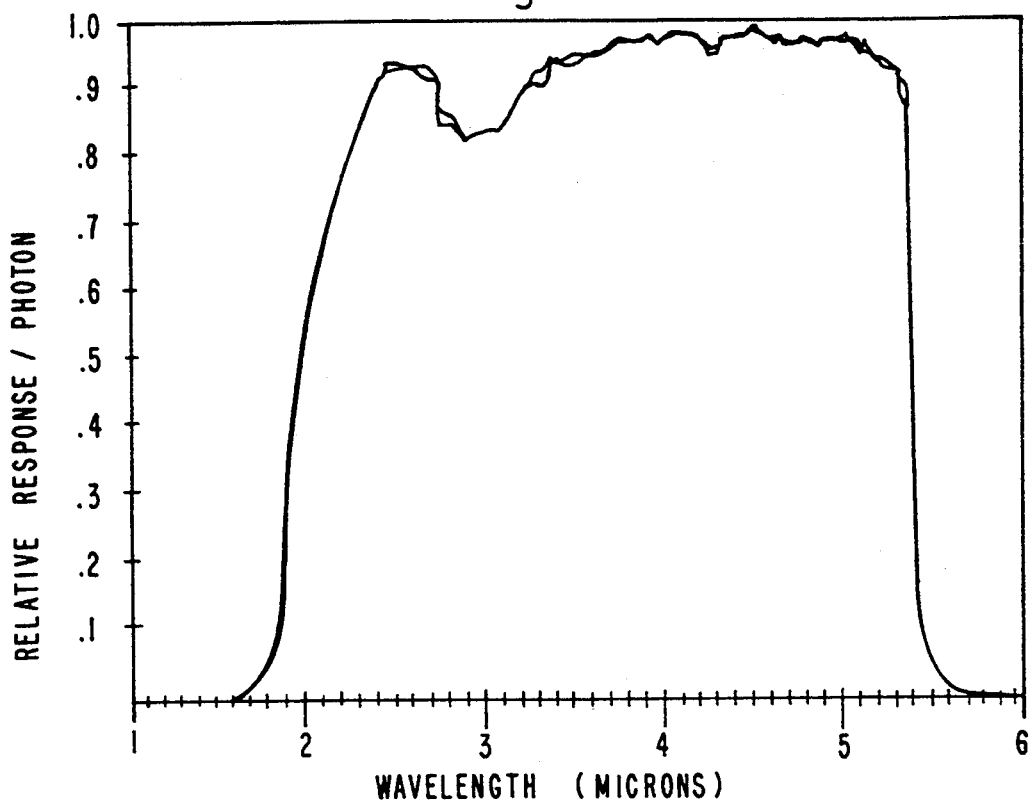

5,449,943

VISIBLE AND INFRARED INDIUM ANTIMONIDE (INSB) PHOTODETECTOR WITH NON-FLASHING LIGHT RECEIVING SURFACE

This is a continuation of application Ser. No. 07/742,248 filed Aug. 8, 1991, now abandoned.

BACKGROUND OF THE INVENTION

1. Field of the Invention

The present invention relates to a wideband indium antimonide (InSb) photodetector device having a passivated light receiving surface which eliminates the degradation of photoresponse in the infrared region due to flashing and enables the photodetector to detect visible as well as infrared light radiation.

2. Description of the Related Art

Back-side illuminated InSb photodetector devices such as photodiode arrays have been conventionally used for detecting infrared light radiation having wavelengths between 1 and 5.5 micrometers. However, they have been unusable for detecting light both in the visible and infrared regions due to a "flashing" effect which is inherent in conventional back-side passivated/anti-reflection coated InSb devices.

A conventional passivation/anti-reflection coating is formed by anodization of the back-side, or light receiving surface of the photodetector device substrate. The relative photoresponse of a conventional anodized InSb photodetector as a function of wavelength is illustrated in FIG. 1. It will be seen that the photoresponse rises from a low value in the visible range below 1 micrometer to a peak at approximately 5 micrometers, after which it drops abruptly. This is highly undesirable since the optimal response per photon would be constant at all operating wavelengths.

The prior art approach to utilization of InSb photodetectors for detecting infrared radiation is to provide a filter which selectively prevents light of visible and ultraviolet wavelengths from reaching the device as shown in FIG. 2. This, of course, renders the device inoperative for detecting visible light.

Another problem with InSb photodetectors in the visible wavelength range is an avalanche effect which occurs at less than 0.7 micrometers as is further illustrated in FIG. 1. The photoresponse increases abruptly as the wavelength decreases below this value, rendering the device essentially unusable for detection of radiation of shorter wavelengths due to blooming for imaging applications.

SUMMARY OF THE INVENTION

The method of the present invention produces an InSb photodetector device which operates effectively over a wide wavelength range including the visible and infrared bands.

In accordance with the present invention, the light receiving or back-side surface of an InSb photodetector device substrate is cleaned to remove all oxides of indium and antimony therefrom. Passivation and/or partially visible light blocking layers are then formed thereon of materials which do not react with InSb to form a structure which would have carrier traps therein and cause flashing. The passivation and/or partially visible light blocking layers may include a thin layer of a semiconductor such as germanium, or oxide and nitride materials with a visible light blocking filter material, such as silicon dioxide/silicon, and/or silicon nitride/silicon. The optical cutoff wavelength and thickness of the visible light blocking layer are selected to suppress the avalanche effect in the device at visible wavelengths.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 2 is a graph illustrating the relative photoresponse of a conventional anodized InSb photodetector as a function of wavelength with a complete visible light blocking filter;

FIGS. 4 and 5 are graphs illustrating the relative quantum efficiency of the present photodetector device including passivation layers formed of different respective materials.

DETAILED DESCRIPTION OF THE INVENTION

The conventional method of passivating the backside surface of an InSb photodetector by anodization is described in an article entitled "Formation and Properties of Anodic Oxide Films on Indium Antimonide", by T. Sakurai et al, Japanese Journal of Applied physics, vol. 7, no. 12, Dec. 1968, pp. 1491–1496. An InSb substrate or wafer is immersed in an electrolyte solution of potassium hydroxide (KOH), and a positive electrical potential is applied thereto. A negative potential is applied to a mercuric (platinum is now commonly used) electrode which is also immersed in the KOH solution. Electrolytic action occurs, with the InSb wafer acting as the anode, such that an oxide layer which constitutes the anodic passivation layer is formed on the wafer.

As described in an article entitled "Surface Study of Anodized Indium Antimonide" by R. Hung et al, Journal of applied Physics, vol. 41, no. 5, Apr. 1970, pp. 2185–2189, the anodized oxide layer is predominantly microcrystalline $In_2O_3$ ($Sb_2O_3$ is also a constituent with the ratio of 2 $In_2O_3$ to 1 $Sb_2O_3$) with a high concentration of antimony located interstitially within the oxide film. The antimony ions which are located close to the oxide/InSb interface form carrier traps.

The present invention is based on the realization that the flashing is caused by hot electrons generated by photons of visible or ultraviolet radiation which are captured by these electron traps in the passivation layer. The trapped electrons suppress the infrared response by recombining with photogenerated minority carriers (holes for the N-type base) before they are collected in the semiconductor P-N junctions of the device.

The $In_2O_3$ and $Sb_2O_3$ oxides, in addition to any other oxides which may be formed through reaction of indium and/or antimony with oxygen, are referred to as "native oxides". The present invention overcomes the flashing problem by eliminating these native oxides and associated carrier traps from the light receiving surface of an InSb photodetector.

Figure 6:
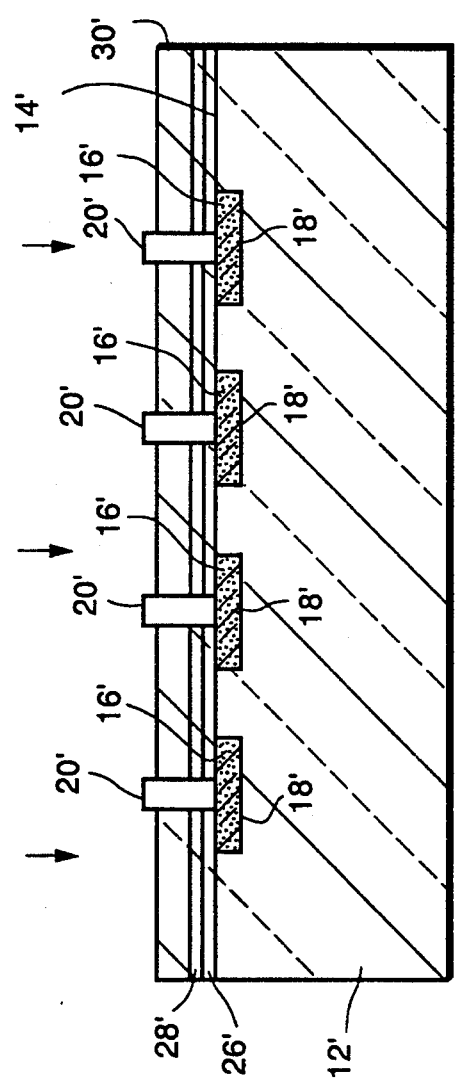
FIG. 6 is a simplified sectional view of another embodiment of a photodetector device embodying the present invention.

The present invention is an InSb photodetector device comprising an InSb substrate having a light receiving surface with substantially no oxides of indium and antimony thereon and at least one of a passivation layer and a partially visible light blocking layer formed on that surface, the layer being of a material which does not produce carrier traps through reacting with InSb. The light receiving surface may be the back or front-side surface of the device. Embodiments of this invention are shown in FIGS. 3 and 6.

Figure 3:
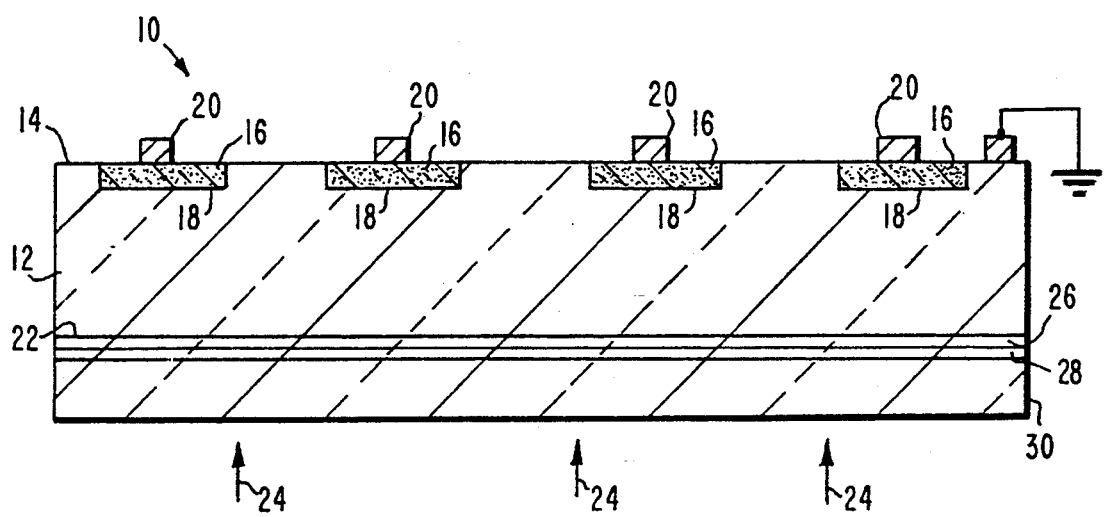
FIG. 3 is a simplified sectional view of a photo-detector device embodying the present invention.

Referring now to FIG. 3, an InSb photodetector device embodying the present invention is generally designated as 10, and includes an InSb wafer or substrate 12 having a front surface 14 in which at least one photosensitive semiconductor junction is formed. The substrate 12 is typically lightly doped with an N type dopant such as tellurium. Heavily doped P+ type regions 16 are formed in the surface 14 through ion implantation of beryllium. Photosensitive semiconductor junctions 18 which constitute photodiodes are formed at the interfaces of the P+ regions 16 and the N-type substrate 12. Ohmic contacts 20 are formed on the P+ regions 16. A complete circuit path for the photodiodes is provided by means which are symbolically indicated by connection of the substrate 12 to ground.

The substrate 12 has a back-side or light receiving back surface 22 which is designed to receive incident light for detection by the device 10 as indicated by arrows 24. It will be noted, however, that the light receiving surface 22 may alternatively be the front-side surface of the device. The substrate 12 is thin enough for the photogenerated carriers to diffuse therethrough from beneath the surface 22 to the junctions 18 and cause carrier collection at the junctions 18. During the present fabrication process, the surface 22 is thoroughly cleaned to remove all native oxides of indium and antimony therefrom.

In accordance with the present invention, passivation and/or visible light blocking layers 26 and 28 are formed on the back surface 22 from a material which will not react with indium and/or antimony to form either native oxides or any other substance or structure which would have carrier traps therein and cause flashing. The material of the passivation and/or partially visible light blocking layers 26 and 28 may be a semiconductor material such as germanium, cadmium telluride, or gallium arsenide, or an oxide material such as silicon dioxide and/or a nitride material such as silicon nitride followed by a partially visible light blocking thin silicon layer, although the scope of the invention is not so limited. The passivation and/or partially visible light blocking layers 26 and 28 may be formed of any materials which will not produce carrier traps when formed on the surface 22, will passivate the surface 22 by preventing reaction thereof with the ambient atmosphere, and will be sufficiently transparent to light within a selected wavelength range to enable the device 10 to operate.

If desired, an anti-reflection coating or layer 30 may be formed over the partially visible light blocking layer 28. The layer 30 may be formed of a conventional anti-reflection material such as $In_2O_3$, SiO, or ZnSe to a thickness of several thousand Angstroms. Alternatively, an anti-reflection coating consisting of several layers for wide band applications may be formed over the partially visible light blocking passivation layer 26, although not specifically illustrated.

The passivation and/or partially visible light blocking layers 26 and 28 may be formed of a semiconductor material such as germanium using a conventional thin film evaporation technique, or of an oxide and/or nitride of silicon using a conventional plasma deposition technique followed by evaporation of a partially visible light blocking material such as silicon using a conventional thin film evaporation technique, although the invention is not so limited. Where the layer 28 is formed of germanium, the preferred thickness is within a range of approximately 50 to 250 Angstroms. Where the layer 26 is formed of $SiO_2$ and/or $Si_3N_4$, the preferred thickness is within a range of approximately 100 to 150 Angstroms, followed by the layer 28 with the preferred thickness of about 2,000 Anstroms of Si.

In FIG. 6, the passivation and/or partially visible light blocking layers 26' and 28' respectively, are located on the front surface 14' which is the light receiving surface on the substrate 12' which has P+ regions 16', junctions 18', contacts 20 ' and an antireflection layer 30', as discussed with respect to FIG. 3.

As described above, the avalanche phenomenon which occurs at wavelengths below 0.7 micrometers has a highly detrimental blooming effect on photodetection/imaging in the visible wavelength range. This can be reduced to an extent which enables the present device 10 to operate effectively at visible wavelengths by selection of the optical cutoff wavelength and thickness of the visible light blocking passivation layer 28. A preferred value for the cutoff wavelength is within the range of approximately 1 to 2 micrometers. The cutoff wavelength for germanium is approximately 1.8 micrometers, whereas that for silicon is approximately 1.1 micrometers.

The optical transmissivity of the layer 28 begins to drop off at the cutoff wavelength, and decreases as the wavelength decreases at a rate which depends on the thickness of the layer 28. This causes a reduction in incident light intensity as an inverse function of wavelength. The avalanche effect causes the maximum photo-response at less than 0.5 micrometers. The cutoff effect of the visible light blocking layer 28 causes decreased incident light intensity which results in reduced photo-response as the wavelength decreases. These two effects counteract each other, thereby providing more constant photoresponse in the visible wavelength region than is possible with a conventional InSb photodetector.

Figure 1:
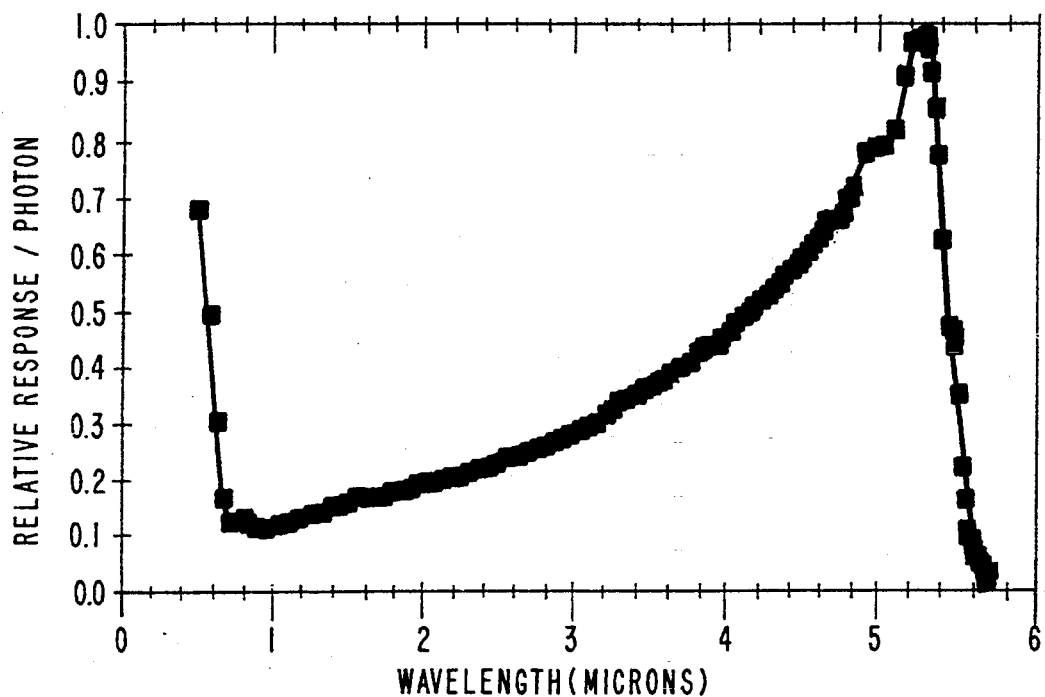
FIG. 1 is a graph illustrating the relative photoresponse of a conventional anodized InSb photodetector as a function of wavelength without a visible light blocking filter.
Figure 4:
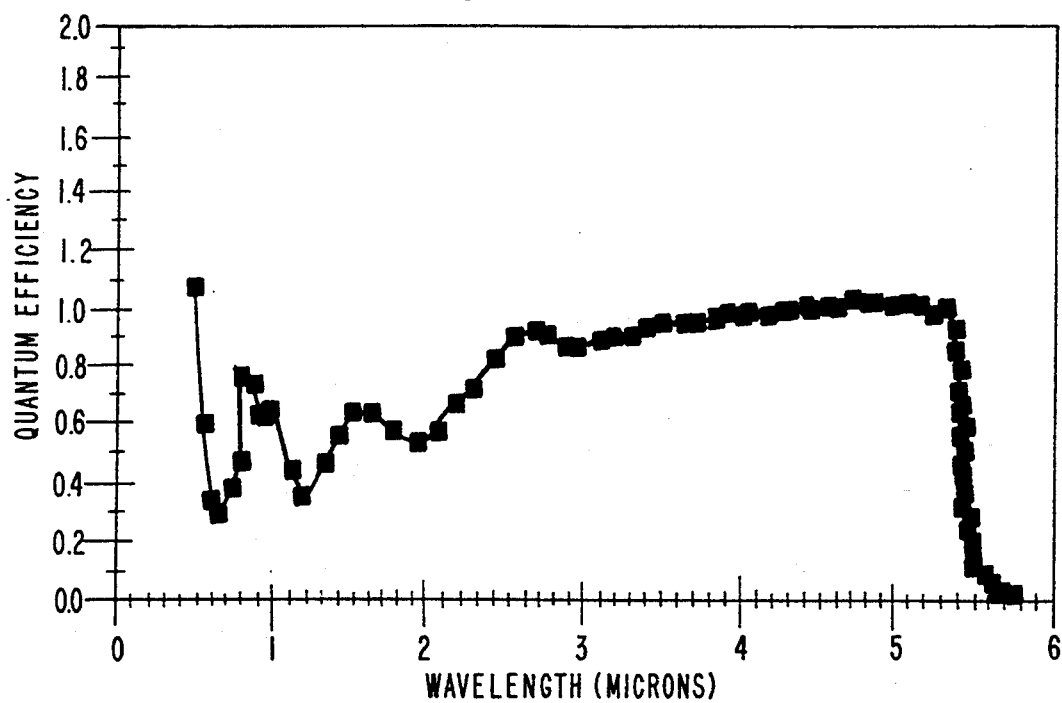

FIGS. 4 and 5 illustrate the performance of the present invention. These graphs plot the quantum efficiency of the photodetector, which is a measure of the efficiency of photoresponse per photon, as a function of wavelength. The measurements were taken with the samples at a temperature of 80K. FIG. 4 illustrates the case of a 50 Angstrom thick partially visible light blocking layer 28 of germanium, with an anti-reflection coating 30 formed thereon. FIG. 5 illustrates the case of a 130 Angstrom thick $SiO_2/Si_3N_4$ passivation layer 26 followed by a 2,000 Angstrom thick Si partially visible light blocking layer 28, with an anti-reflection coating 30 formed thereon. It will be seen that the photoresponse over both the visible and infrared wavelength bands is much higher than that of the conventional configuration illustrated in FIG. 1. Those spectrals exhibit a greater fluctuation in photo-response from the visible range up to approximately 2.5 micrometers. This fluctuation is due, however, to the anti-reflection coating which is primarily adjusted for the infrared region.

EXAMPLE

Experimental photodetector devices which produced the results illustrated in FIGS. 4 and 5 were fabricated using the following procedure.

(1) The P+ regions 16, contacts 20, and other associated elements were formed in the front side 14 of an InSb substrate or wafer 12 which was initially 750 micrometers thick to form operative photodiode junctions 18.

(2) The back side 22 was abraded until the thickness of the substrate 12 was reduced to approximately 15 micrometers.

(3) The front side 14 of the substrate 12 was mounted on a sapphire slide, and areas of the back side 22 except on which the passivation and/or partially visible light blocking layers 26 and 28 were to be formed were protected with a thick coating of photoresist.

(4) The surface 22 was plasma etched using oxygen plasma for 10 minutes at a pressure of 0.5 Torr and power of 150 W.

(5) The surface 22 was chemically etched using a two step process.
 (a) 30 seconds in a 50/50 solution of hydrochloric acid/de-ionized water.
 (b) 3 minutes in a 70/10 solution of lactic acid/nitric acid.

Steps (4) and (5) in combination cleaned the back surface 22 by removing the native oxides, crystal damage caused by the thinning process in step (2), and some of the InSb material, such that the final thickness of the substrate 12 was between approximately 8 to 12 micrometers.

(6) The substrate 12 was rinsed in a de-ionized water bath, and dried by $N_2$ gas flow. The following step of applying the passivation and partially visible light blocking layers 26 and 28 were performed within a sufficiently short length of time that no appreciable native oxides were able to form on the surface 22 through exposure to the ambient atmosphere.

(7) The passivation and partially visible light blocking layers 26 and 28 were formed on the surface 22 of the substrate 12. Germanium layers was formed using conventional electron-beam thin film evaporation, whereas silicon dioxide and nitride layers were formed using conventional plasma deposition. In the latter case, a passivation layer 26 including $SiO_2$ and $Si_3N_4$ was formed using a plasma including $N_2$, $O_2$, and silane ($SiH_4$).

(8) The anti-reflection coating 30, if applicable, was deposited onto the partially visible light blocking layer 28.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A broadband indium antimonide (InSb) photodetector device comprising:
   an InSb substrate having a light receiving surface with substantially no native oxides of indium or antimony thereon, and accordingly substantially no carrier traps for electrons excited in the substrate by incident visible radiation, and a surface opposite said light receiving surface,
   at least one photosensitive semiconductor junction formed in either the light receiving surface or said opposite surface; and
   a passivation layer formed on said substantially native oxide-light receiving surface, said passivation layer being of a material which (a) is substantially transparent to a broadband spectrum that includes visible and infrared (IR) radiation components and (b) does not produce carrier traps through reacting with InSb,
   said detector responding to illumination of said light receiving surface by light over said broadband spectrum by generating electrons in the substrate in response to the visible component, and generating electron-hole pairs in the substrate in response to the IR component, with said holes moving to said photosensitive junction without substantial interference from the visible light generated electrons.

2. A device as in claim 1, in which the material of the passivation layer is selected from the group consisting of oxide and nitride materials.

3. A device as in claim 2, in which the material is selected from the group consisting of silicon dioxide and silicon nitride.

4. A broadband indium antimonide (InSb) photodetector device comprising:
   an InSb substrate having a light receiving surface with substantially no native oxides of indium or antimony thereon, and accordingly substantially no carrier traps for electrons excited in the substrate by incident visible radiation, and a surface opposite said light receiving surface,
   at least one photosensitive semiconductor junction formed in either the light receiving surface or said opposite surface; and
   a passivation layer formed from one of the group consisting of an oxide of silicon, a nitride of silicon and a silicon oxynitride to a thickness within the range of approximately 100 to 150 Angstroms on said light receiving surface, said passivation layer being of a material which is substantially transparent to a broadband spectrum that includes visible and infrared (IR) radiation components and does not produce carrier traps through reacting with InSb,
   said detector responding to illumination of said light receiving surface by light over said broadband spectrum by generating electrons in the substrate in response to the visible component, and generating electron-hole pairs in the substrate in response to the IR component, with said holes moving to said photosensitive junction without substantial interference from the visible light generated electrons.

5. A device as in claim 1, in which said at least one photosensitive semiconductor junction is formed in the surface of the substrate opposite said light receiving surface.

6. A device as in claim 5, in which the substrate is approximately 8 to 12 micrometers thick.

7. A device as in claim 1 in which said at least one photosensitive semiconductor junction is formed in the light receiving surface.

8. A device as in claim 7, in which the substrate is approximately 8 to 12 micrometers thick.

9. A broadband indium antimonide (InSb) photodetector device, comprising:
- an InSb substrate having a light receiving surface with substantially no native oxides of indium or antimony thereon, and accordingly substantially no carrier traps for electrons excited in the substrate by incident visible radiation, and a surface opposite said light receiving surface, and
- a $Si_3N_4$ passivation layer formed on said substantially native oxide free light receiving surface.

10. A device as in claim 9, wherein said passivation layer has a thickness within the range of approximately 100 to 150 Angstroms.

11. A broadband indium antimonide (InSb) photodetector device, comprising:
- an InSb substrate having a light receiving surface with substantially no native oxides of indium or antimony thereon, and accordingly substantially no carrier traps for electrons excited in the substrate by incident visible radiation, and a surface opposite said light receiving surface,
- at least one photosensitive semiconductor junction formed in either the light receiving surface or said opposite surface, and
- a $Si_3N_4$ passivation layer formed on said substantially native oxide free light receiving surface.

12. A device as in claim 11, wherein said passivation layer has a thickness within the range of approximately 100 to 150 Angstroms.

* * * * *